US007026885B2

(12) United States Patent
Baras et al.

(10) Patent No.: US 7,026,885 B2
(45) Date of Patent: Apr. 11, 2006

(54) LOW-LOSS COUPLER

(75) Inventors: Torben Baras, New Providence, NJ (US); Norbert C Metz, Morris, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 135 days.

(21) Appl. No.: 10/448,824

(22) Filed: May 30, 2003

(65) Prior Publication Data

US 2004/0239441 A1 Dec. 2, 2004

(51) Int. Cl.
*H03M 1/10* (2006.01)

(52) U.S. Cl. ...................................... 333/120; 333/204

(58) Field of Classification Search ................ 333/120, 333/116, 118, 115, 109, 125, 21 A, 106, 108, 333/127, 128, 137, 246
See application file for complete search history.

(56) References Cited

U.S. PATENT DOCUMENTS

| | | | | |
|---|---|---|---|---|
| 4,316,160 | A * | 2/1982 | Dydyk | 333/120 |
| 5,028,880 | A * | 7/1991 | Sakai | 333/120 |
| 5,208,569 | A * | 5/1993 | Michelangelo et al. | 333/257 |
| 5,237,294 | A * | 8/1993 | Roederer et al. | 333/120 |
| 5,280,292 | A * | 1/1994 | Tondryk | 333/116 |
| 5,400,002 | A * | 3/1995 | Takahashi et al. | 333/204 |
| 5,479,142 | A * | 12/1995 | Takahashi et al. | 333/204 |
| 5,614,876 | A * | 3/1997 | Takahashi et al. | 333/204 |
| 5,659,274 | A * | 8/1997 | Takahashi et al. | 333/204 |
| 6,710,679 | B1 * | 3/2004 | Zhu | 333/120 |
| 6,803,838 | B1 * | 10/2004 | Hoyland | 333/120 |

* cited by examiner

*Primary Examiner*—Don Le
*Assistant Examiner*—Lam T. Mai

(57) ABSTRACT

A coupler includes a first set of ports coupled to a first ring, a second set of ports coupled to a second ring, and a plurality of connecting elements coupled between the first and second rings. The coupler provides low loss insertion and high port isolation and may be used as a standalone coupler or as an elementary device for building Butler matrices of varying configurations.

19 Claims, 4 Drawing Sheets

LOW-LOSS COUPLER

BACKGROUND OF THE INVENTION

1. Field of the Invention

This invention relates generally to the field of balancing of power amplifiers, and, more particularly, to a low-loss coupler.

2. Description of the Related Art

Power amplifier balancing is a well-known and established method to distribute a varying load of different channels equally among a single amplifying element. Commonly available 3 dB hybrid devices or other types of coupler elements are used to split radio frequency ("RF") signals into a plurality of components prior to amplification and to combine the components after they have been amplified. This splitting, amplifying, and combining operation takes advantage of coherent superposition on the coupler's output ports, which may lead to the cancellation of most components, and constructive interference for only one of the signal components.

A signal applied to one input port of the coupler element will travel different paths inside the coupler element. The different paths subject the signal to different phase changes along the different paths, which can result in a total cancellation at the other input ports, or a partial constructive superposition on the output ports. In a balanced element, the input power may be distributed equally among the output ports, but high isolation is maintained between all input ports with a low input reflection. The operation complimentary to splitting a signal is the combining of signal components and providing each component at a single output port. The combining operation is made possible by injecting the single components in a well-defined phase state and amplitude into the input ports of a coupler element. Due to the same physical mechanism as used for the equal splitting, the injected components may appear on a single output port. Additionally, a plurality of signals from different sources may be superimposed.

Typically, multi-port combiners may be constructed by combining multiple (e.g., 3 dB) hybrid devices to form a network structure, commonly referred to as a Butler matrix. Butler matrices based on a 2-way combiner may therefore have a 1:$2^n$ splitting ratio, where n is a positive integer resulting in $2^n$ input and $2^n$ output ports per network.

In certain communication systems, such as a personal communications service (PCS) system having 3-sector or 6-sector cells, a different number of ports may be required (i.e., 3 or 6). Accordingly, the design of the network is not readily implemented using a regular 2n Butler matrix. Commercially available devices for implementing such networks have significant disadvantages. For example, commercially available combiners are either very large with a medium range insertion loss (e.g., about 0.5 dB) or they may be comparably small but have an increased insertion loss (e.g., about 0.9 dB). Moreover, the commercially available devices show a port isolation not better than −20 dB. These limitations can lead to increased crosstalk between adjacent sectors, thus degrading the system capacity due to an increased interference level.

The present invention is directed to overcoming, or at least reducing the effects of, one or more of the problems set forth above.

SUMMARY OF THE INVENTION

One aspect of the present invention is seen in a coupler including a first set of ports coupled to a first ring, a second set of ports coupled to a second ring, and a plurality of connecting elements coupled between the first and second rings. The coupler provides low loss insertion and high port isolation and may be used as a standalone coupler or as an elementary device for building Butler matrices of varying configurations.

Another aspect of the present invention is seen in a system including a power splitting coupler coupled to receive a plurality of input signals, a phase adjusting coupler coupled to the power splitting coupler, an amplifier stage coupled to the phase adjusting coupler, and a combining coupler coupled to the amplifier stage. The combining coupler includes a first set of ports coupled to a first ring, a second set of ports coupled to a second ring, and a plurality of connecting elements coupled between the first and second rings.

BRIEF DESCRIPTION OF THE DRAWINGS

The invention may be understood by reference to the following description taken in conjunction with the accompanying drawings, in which like reference numerals identify like elements, and in which.

Figure 1:
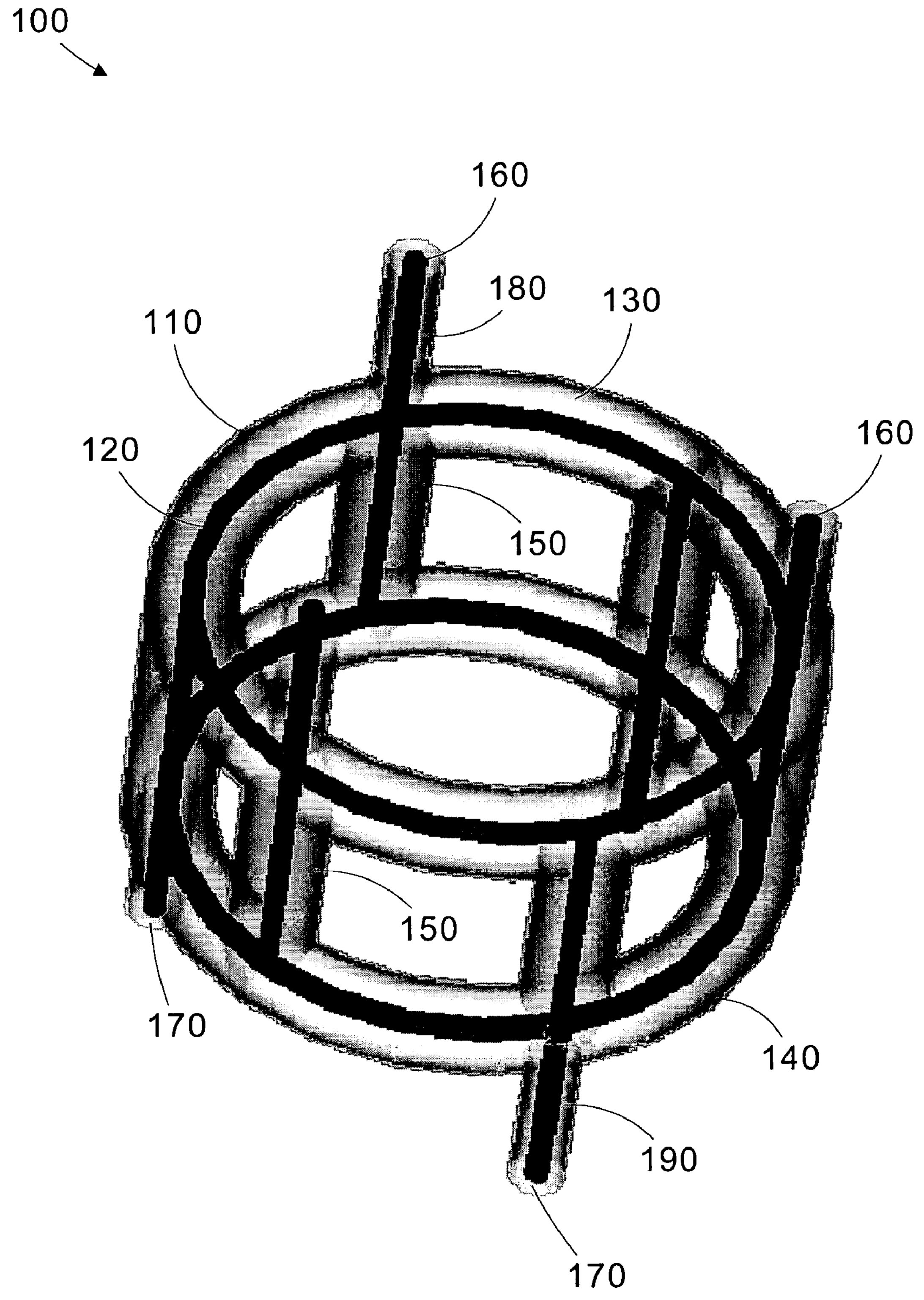
FIG. 1 is an isometric diagram of a coupler in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. Moreover, it should be emphasized that the drawings of the instant application are not to scale but are merely schematic representations, and thus are not intended to portray the specific dimensions of the invention, which may be determined by skilled artisans through examination of the disclosure herein.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to FIG. 1, an isometric diagram of a coupler 100 in accordance with one illustrative embodiment of the present invention is shown. In the embodiment illustrated in FIG. 1, the coupler 100 is implemented using a coaxial transmission line having an outer conductor framework 110 and an inner conductor framework 120 without an inner dielectric material. However, the application of the present invention is not limited to any particular type of transmission line or wave guide structure. For example the coupler 100 may be implemented using rectangular and circular wave guides, printed transmission lines, microstrip lines, slot and strip lines, coplanar waveguides, dielectric wave guides, such as nonradiating waveguides, and the like.

The coupler includes a first ring 130 and a second ring 140. The rings 130, 140 are interconnected by a plurality of connecting elements 150. A first set of ports 160 are coupled to the first ring 130 and a second set of ports 170 are coupled to the second ring 140. In the illustrated embodiment, the ports 160, 170 are aligned with the connecting elements 150, and the ports 160 are staggered with respect to the ports 170. In one embodiment, the connecting elements 150, and thus the ports 160, 170 are distributed symmetrically about the periphery of the first and second rings 130, 140. Typically one set of ports 160, 170 is designated as a set of input ports and the other set of ports 160, 170 is designated as a set of output ports. The particular set designations will depend on the operation being performed (e.g., splitting or combining).

In the illustrated embodiment, the ports 160, 170 are sub-miniature-A (SMA) connectors, and the inner conductor framework 120 is free mounted to the ports 160, 170. The ports 160, 170 illustrated in FIG. 1, are illustrated as including the SMA connectors (not shown) and the stub transmission lines 180, 190 between the SMA connectors and the rings 130, 140. The length of the stub transmission lines 180, 190 may be varied depending on the particular implementation (i.e., depending on package design, space considerations, etc.). In some embodiments, the SMA connectors (not shown) may be coupled directly to the rings 130, 140 with no stub transmission lines being required. Also, the term "ring" is not intended to be limited to circular implementations. For example, straight transmission line segments may be used to implement the rings 160, 170 giving them a hexagonal shape. Other non-circular shapes may be dictated by the space characteristics of the implementing structure.

Although the coupler 100 is illustrated with three ports 160, 170 coupled to each ring 130, 140, respectively, the invention is not limited to the particular number of ports. For example a 1×3 coupler may be implemented with one port 160 on the first ring 130 and three ports 170 on the second ring 170. Alternatively, a 1×3 coupler may also be realized by simply leaving the unneeded ports 160 on the first ring 130 disconnected. Moreover, the number of ports 160, 170, the number of rings 130, 140, and the number of connecting elements 150 may be varied. For example, to implement a 5-way coupler, an intermediate ring (not shown) may be placed between the first and second rings 130, 140 and two sets of connecting elements 150 (e.g., ten connecting elements 150 in each set) may be used.

The coupler 100 in the illustrated embodiment is constructed to have balanced power distributing characteristics. The symmetric structure of the rings 130, 140, the connecting elements 150, and the staggering of the ports 160, 170 contribute to this balanced characteristic. However, if other power distribution characteristics are desired, the number, length, or arrangement of the elements may be varied.

The electrical characteristics of the coupler 100 are also selected to affect the balancing of the power distribution. The electrical characteristics may be defined in terms of electrical length. As those of ordinary skill in the art will appreciate, the electrical length depends on various characteristics of the transmission lines or waveguides used to construct the coupler 100 and the center frequency of the signals provided to the coupler 100. Electrical length is typically expressed in degrees. When an electrical length is used herein, it is to be understood that the length represents effective electrical length. Transmission lines with the same electrical length of X° may have different physical lengths. For example, an integer multiple of 2π radians of electrical length may be added to any transmission line without changing its effective electrical length. Typically, these length changes may be implemented to accommodate space concerns of the implementing circuit (e.g., space or layer on a printed circuit board).

In the illustrated embodiment, the center frequency of the signals to be carried by the coupler 100 is 1.95 GHz (i.e., the PCS transmit band) and the transmit power is approximately 100 watts of RF power. The following specific examples for the characteristics of the coupler 100 represent a structure that was tailored for a PCS environment, however, the application of the present invention is not limited to the particular values determined for this environment. The rings 130, 140 have an electrical length of approximately 390°, which is longer than the resonant wavelength, and an impedance of $1.41{*}Z_0$ resulting in an impedance of 70.71Ω when $Z_0$ equals 50Ω. The electrical length of the connecting elements 150 is approximately 60°, the connecting elements 150 are spaced at intervals of about 65° of electrical length of the rings 130, 140. The connecting elements 150 have an impedance of $1.72{*}Z_0$ or 86.60Ω. Again, other electrical lengths and orientations may be used to tailor the power balancing characteristics of the coupler 100.

A 5-way coupler may be implemented with three rings 130, 140 (i.e., including the intermediate ring (not shown)) having electrical lengths of 650° (i.e., 10×65°), five ports 160, 170 on each ring 130, 140, ten connecting elements 150 between the rings having electrical lengths of 65° and spacing of 65° about the rings 130, 140. Again the ports 160, 170 would align with the connecting elements 150 and would be staggered with respect to each other.

The scattering matrix at resonance frequency of the coupler 100 is:

$$[S] = \frac{e^{-j120^\circ}}{\sqrt{3}} \begin{bmatrix} 0 & 0 & 0 & 1 & 1 & e^{-j120^\circ} \\ 0 & 0 & 0 & e^{-j120^\circ} & 1 & 1 \\ 0 & 0 & 0 & 1 & e^{-j120^\circ} & 1 \\ 1 & e^{-j120^\circ} & 1 & 0 & 0 & 0 \\ 1 & 1 & e^{-j120^\circ} & 0 & 0 & 0 \\ e^{-j120^\circ} & 1 & 1 & 0 & 0 & 0 \end{bmatrix}. \tag{1}$$

Each element $s_{ij}$ represents the power ratio between the power injected into port i exiting port j. The elements in rows 1–3 and columns 1–3 illustrate the ideal decoupling of the first set of ports 160 (e.g., the input ports). The elements in rows 4–6 and columns 4–6 illustrate the ideal decoupling of the second set of ports 170 (e.g., the output ports). The other matrix entries have a magnitude equal to unity, with some having an additional phase term. In combination with the scalar coefficient to the left of the matrix, the unity entries represent equal power splitting among the output ports. Incident power on any input port appears on all output ports attenuated by −4.77 dB. By comparing the scattering matrix with the physical structure of the coupler 100, it is seen that each input port (e.g., 160) has two nearby output ports (e.g., 170) and a third more distant output port (e.g., 170), which accounts for the additional phase term in the scattering matrix.

Figure 2:
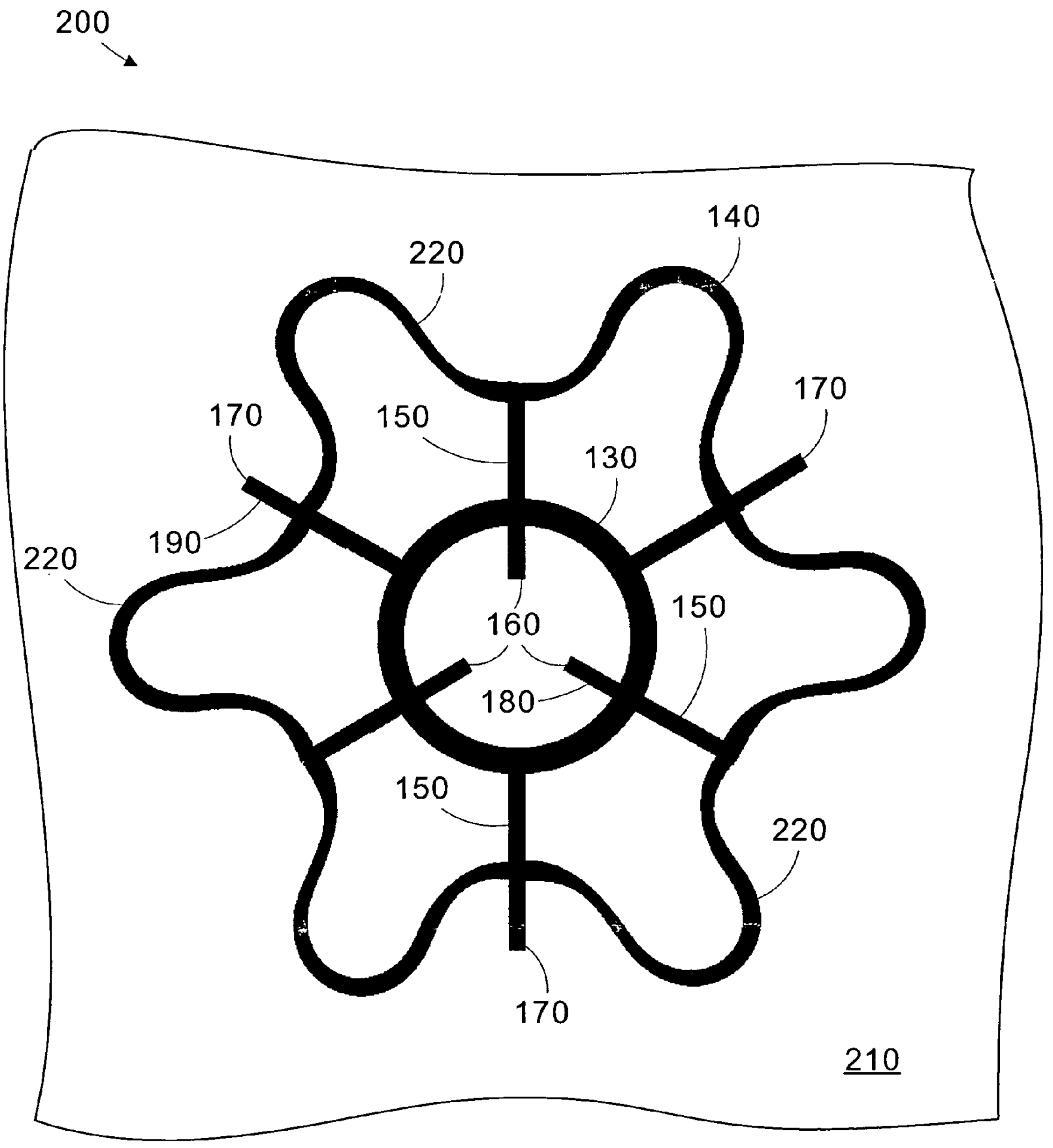
FIG. 2 is a top view of a planar coupler in accordance with another embodiment of the present invention.

Although the coupler 100 of FIG. 1 is illustrated with the rings 130, 140 being in different planes, it is contemplated that different layouts may be used depending on space constraints and implementing technology. If the coupler were to be implemented on a printed circuit board, the rings 130 140 may be either formed on different layers of the circuit board or integer multiples of 2π radians of electrical length may be added to one of the rings 130, 140 to allow formation on a common plane. FIG. 2 illustrates a top view of a coupler 200 implemented on a printed circuit board 210. Note that an integer multiple of 2π radians of electrical length has been added to each segment 220 of the ring 140 between the connecting segments 150 to increase its size and allow it to be placed outside the ring 130 on the same plane. The wavy configuration of the ring 140 conserves space on the printed circuit board 210, as compared to a circular implementation with a wider diameter. Note that is not required that electrical length is added to each of the segments 220 if the additional layout space is not required. It is also possible to add electrical length (i.e., in integer multiples of 2π) to the connecting elements 150 if dictated by the desired layout.

Figure 3:
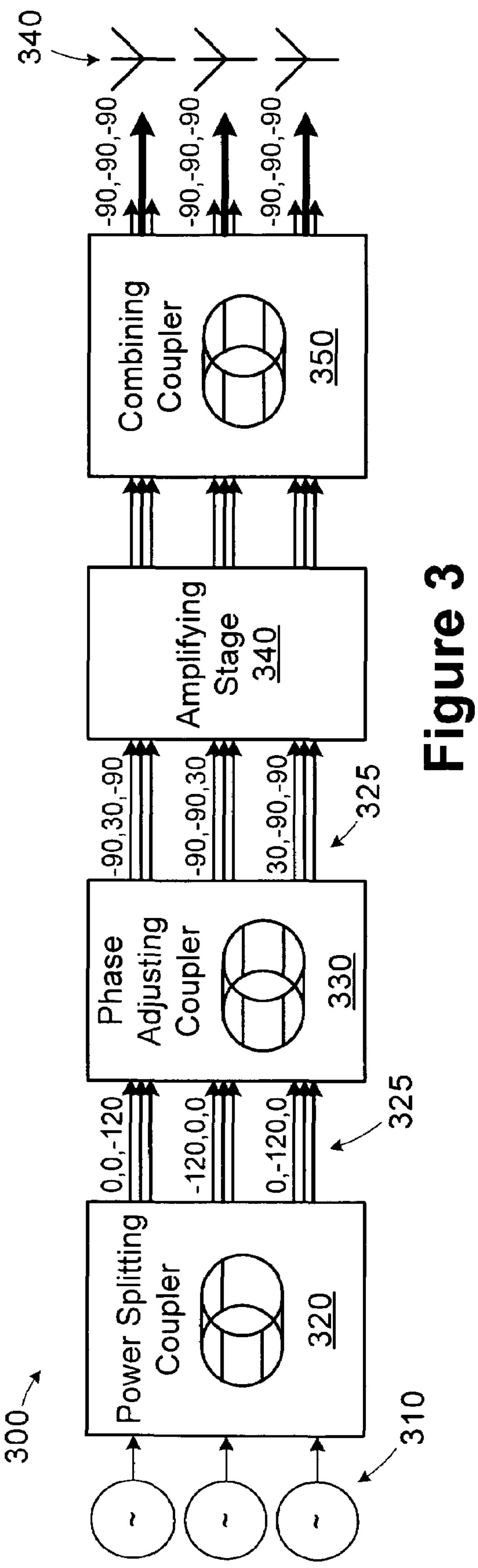
FIGS. 3 and 4 are simplified bock diagrams of a power amplifier balancing circuits employing a coupler of the present invention.

Turning now to FIG. 3, a simplified bock diagram of a power amplifier balancing circuit 300 employing couplers having characteristics similar to the couplers 100, 200 of FIGS. 1 and 2 is shown. Again, the coupler of the present invention is not limited to the coaxial structure 100 of FIG. 1 or the printed circuit board structure 200 of FIG. 2. The circuit 300 includes signal sources 310 for providing three independent signals. The independent signals are applied to input ports of a power splitting coupler 320. The components of the independent signals are distributed amongst the three output ports of the power splitting coupler 320 according to the scattering matrix given above in Equation (1). The phase state of the components is indicated above the thin arrows 325 representing the individual components. The power splitting coupler 320 is followed by a phase adjusting coupler 330 that changes the phase of the signal components as indicated. A conventional amplifier stage 340 amplifies the signal components provided by the phase adjusting coupler 330. A combining coupler 350 receives amplified signal components, adjusts the phase as indicated, and provides output signals to an array of antennas 340. As will appreciated by those of ordinary skill in the art, matching circuitry (not shown) may be implemented between the power splitting coupler 320 and the phase adjusting coupler 330 and/or in other places to tune the circuit 300.

Figure 4:
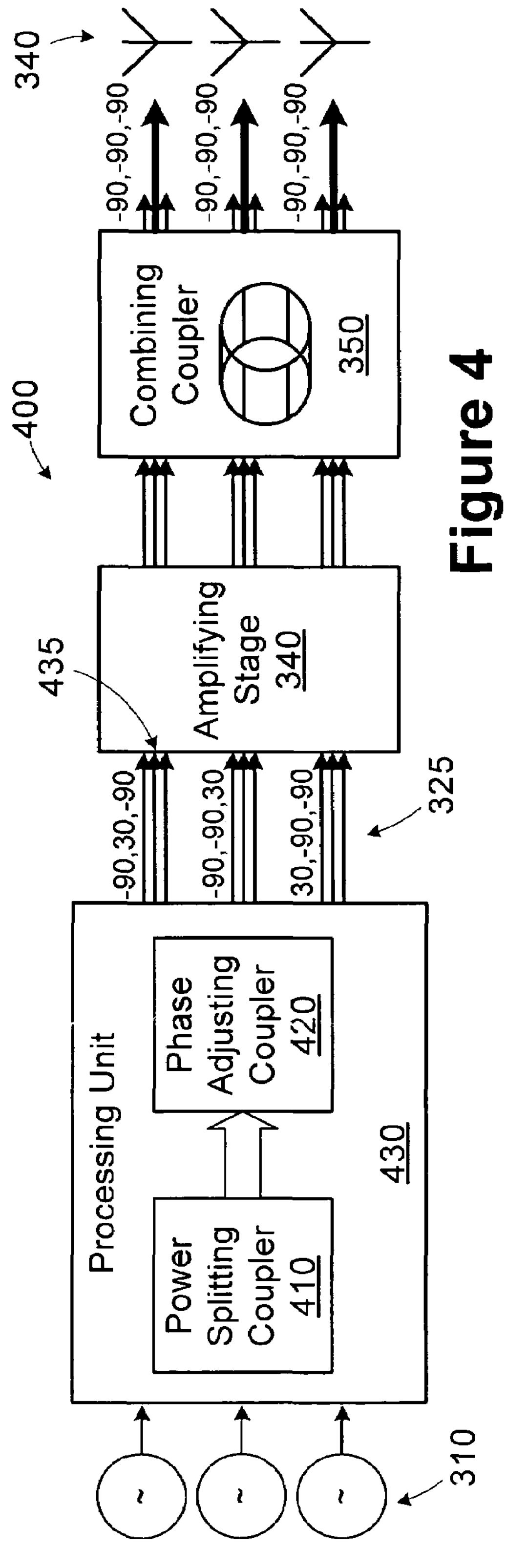

FIG. 4 illustrates a simplified bock diagram of an alternative embodiment of a power amplifier balancing circuit 400. In the circuit 400, the power splitting coupler 410 and the phase adjusting coupler 420 are implemented using software executed by a processing unit 430. The processing unit 430 delivers output signals having the phase characteristics indicated at the input ports 435 to the amplifier stage 340. The election between the "hard" implementation of FIG. 3 and the partial "soft" implementation of FIG. 4 depends on the processing capacity of the device employing the power amplifier balancing circuit 300, 400, and other implementation specific factors.

Figure 5:
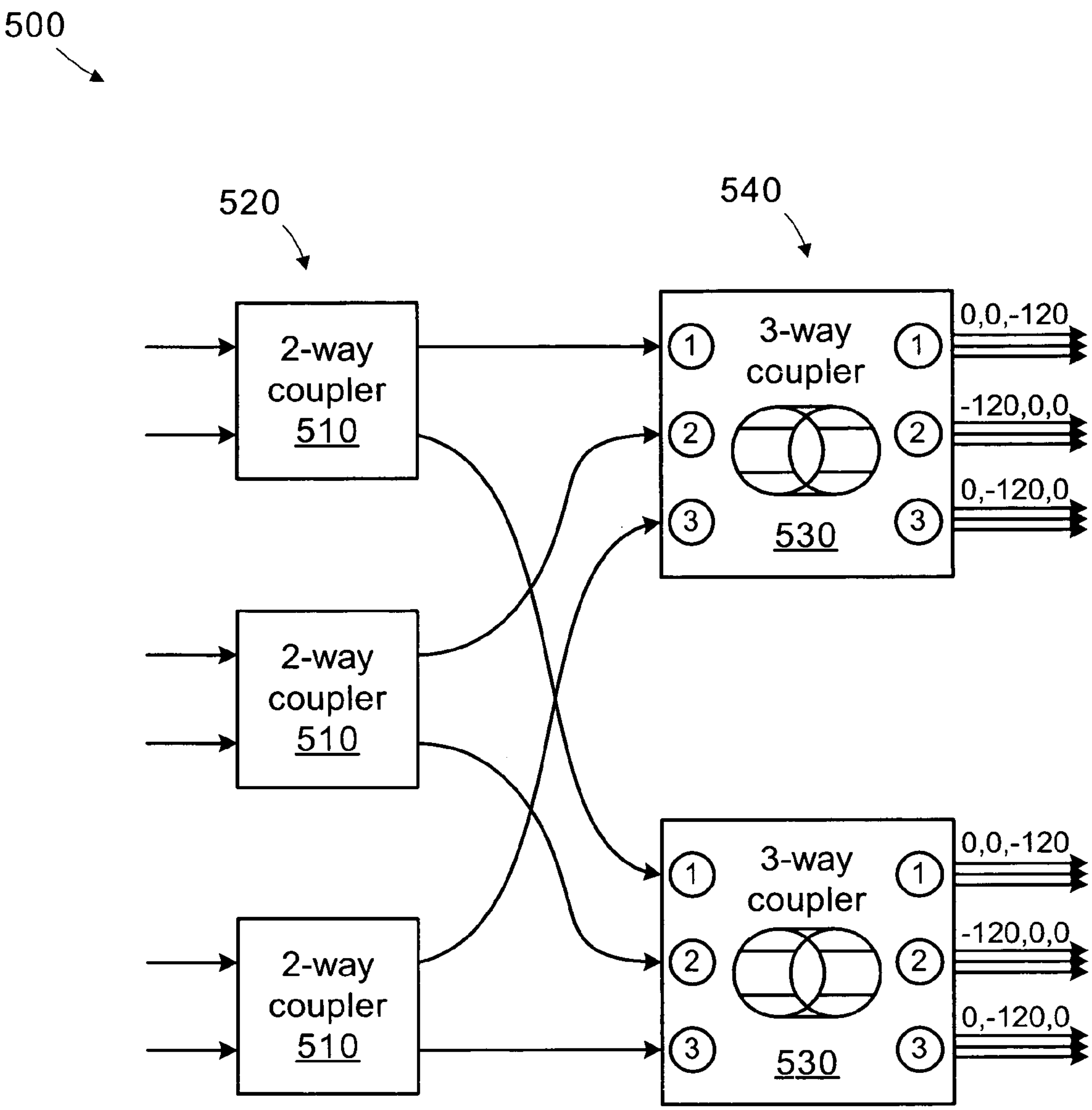
FIG. 5 is a simplified block diagram of a Butler matrix employing a coupler of the present invention.

Referring now to FIG. 5, a simplified block diagram of a Butler matrix 500 using couplers employing aspects of the present invention is provided. The illustrated Butler matrix 500 is a 6×6 matrix. Three conventional two-way couplers 510 are employed in a first stage 520, and two three-way couplers 530 (e.g., the couplers 100 or 200) are employed in a second stage 540 to generate the 6×6 structure. As will be appreciated by those of ordinary skill in the art, different Butler matrices may be constructed by using different combinations of couplers 510, 530 in different stages.

The coupler 100, 200 of the present invention provides low loss insertion and high port isolation. The coupler 100, 200 may be used in a 3-sector PCS cell implementation as a three-way combiner or as an elementary device for building Butler matrices of varying configurations. The characteristics of the coupler 100, 200 may also be varied to realize different power splitting ratios and different number of ports.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

We claim:

1. A coupler, comprising:
a first set of ports coupled to a first ring;
a second set of ports coupled to a second ring; and
a plurality of connecting elements coupled between the first and second rings, wherein the first and second rings have an electrical length of between about 350° and 430° and the plurality of connecting elements each have an electrical length of between about 45° and 75°.

2. The coupler of claim 1, wherein at least one of the first and second rings and the connecting elements comprises at least one wave guide.

3. The coupler of claim 1, wherein at least one of the first and second rings and the connecting elements comprises at least one transmission line.

4. The coupler of claim 1, wherein at least one of the first and second sets of ports comprises at least two ports.

5. The coupler of claim 1, wherein the first and second rings have approximately the same electrical length.

6. A coupler, comprising:
a first set of ports coupled to a first ring;
a second set of ports coupled to a second ring; and
a plurality of connecting elements coupled between the first and second rings, wherein the first and second rings have an electrical length of about 390°, and the connecting elements have an electrical length of about 60°.

7. A coupler, comprising:
a first set of ports coupled to a first ring;
a second set of ports coupled to a second ring; and
a plurality of connecting elements coupled between the first and second rings, wherein the first and second sets of ports each comprise three ports, the first and second rings have an electrical length of about 390°, the ports in the first set are distributed about the first ring at intervals of about 65° of electrical length, and the ports in the second set are distributed about the second ring at intervals of about 65° of electrical length.

8. A coupler, comprising:
a first set of ports coupled to a first ring;
a second set, of ports coupled to a second ring; and
a plurality of connecting elements coupled between the first and second rings wherein the ports in the first and second sets are distributed approximately evenly around the first and second rings, respectively.

9. A coupler, comprising:

a first set of ports coupled to a first ring;

a second set of ports coupled to a second ring; and a plurality of connecting elements coupled between the first and second rings, wherein the ports in the first set are staggered with respect to the ports in the second set.

10. A coupler, comprising:

a first set of ports coupled to a first ring;

a second set of ports coupled to a second ring; and a plurality of connecting elements coupled between the first and second rings, wherein the first set comprises at least three ports and the second set comprises at least three ports.

11. The coupler of claim 10, wherein the plurality of connecting elements comprise six connecting elements, three of the connecting elements being aligned with the first set of three ports coupled to the first ring and three of the connecting elements being aligned with the second set of three ports coupled to the second ring.

12. A couplet, comprising:

a first set of ports coupled to a first ring;

a second set of ports coupled to a second ring; and a plurality of connecting elements coupled between the first and second rings, wherein the electrical length of the first ring is approximately equal to the electrical length of the second ring plus an integral multiple of $2\pi$.

13. The coupler of claim 12, wherein the first and second rings exist in a common plane.

14. A coupler, comprising:

a first set of ports coupled to a first ring;

a second set of ports coupled to a second ring; and a plurality of connecting elements coupled between the first and second rings, wherein the first and second rings exist in different planes.

15. A coupler, comprising:

a first set of ports coupled to a first ring;

a second set of ports coupled to a second ring; and a plurality of connecting elements coupled between the first and second rings, wherein the first and second rings have at least one of a substantially circular shape and a substantially polygonal shape, the number of sides in the polygonal shape being dependent on the number of connecting elements.

16. A system comprising:

a power splitting coupler coupled to receive a plurality of input signals;

a phase adjusting coupler coupled to the power splitting coupler;

an amplifier coupled to the phase adjusting coupler;

a combining coupler coupled to the amplifier stage, comprising:

a first set of ports coupled between a first ring and the amplifier;

a second set of ports coupled to a second ring; and a plurality of connecting elements coupled between the first and second rings; and a processing unit configured to implement the power splitting coupler and the phase adjusting coupler.

17. The system of claim 16, wherein the power splitting coupler and the phase adjusting coupler have the same structure as the combining coupler.

18. A coupler having at least one input signal and a plurality of output signals, comprising:

a first ring for receiving the at least one input signal and for generating a plurality of input signal components; and a plurality of connecting elements for providing the plurality of input signal components to a second ring, the second ring being adapted to generate the plurality of output signals, each output signal comprising at least one of the input signal components, wherein the first ring is adapted to receive a plurality of input signals, and the second ring is adapted to generate the output signals, each output signal comprising at least one of the input signal components of each input signal.

19. The coupler of claim 18, wherein each input signal comprises an independent input signal, and the second ring is adapted to generate each output signal as a combined signal.

* * * * *